(12) United States Patent
Maida (10) Patent No.: US 6,420,931 B1
(45) Date of Patent: Jul. 16, 2002

(54) HIGH SWING OUTPUT CIRCUIT HAVING DIFFERENTIAL TO SINGLE-ENDED CONVERSION AND METHOD

(75) Inventor: Michael Maida, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/546,729

(22) Filed: Apr. 11, 2000

Related U.S. Application Data (63) Continuation-in-part of application No. 09/544,009, filed on Apr. 6, 2000, now Pat. No. 6,366,170.

(51) Int. Cl.⁷ .............................................. H03P 3/45
(52) U.S. Cl. ................................. 330/255; 330/259
(58) Field of Search ............................ 330/255, 259, 330/301, 258

(56) References Cited

U.S. PATENT DOCUMENTS

| | | | | |
|---|---|---|---|---|
| 4,533,876 A | * | 8/1985 | Haque et al. | 330/253 |
| 5,212,455 A | * | 5/1993 | Pernici et al. | 330/255 |
| 5,293,136 A | * | 3/1994 | Ryat | 330/258 |
| 5,512,859 A | * | 4/1996 | Moraveji | 330/255 |
| 5,936,468 A | * | 8/1999 | Wiese et al. | 330/255 |
| 5,955,922 A | * | 9/1999 | Nicollinni et al. | 330/258 |
| 6,163,217 A | * | 12/2000 | Matsubara | 330/255 |

* cited by examiner

Primary Examiner—Robert Pascal
Assistant Examiner—Khanh Van Nguyen
(74) Attorney, Agent, or Firm—Girard & Equitz LLP

(57) ABSTRACT

An amplifier circuit which operates to level shift a differential input signal and to provide a single-ended output. The circuit includes a level shifting stage which defines two current paths, with one path being controlled by one component of the differential input and the other path being controlled by the other component. A transistor is connected in series with each of the current paths. A driver stage coupled to the first and second current paths provides first and second driver outputs indicative of voltage levels on the first and second current paths. A common mode feedback circuit operates to alter current flow in the current paths in response to the first and second driver outputs. An output stage includes one output transistor coupled between one power supply rail and an amplifier output and another transistor output transistor coupled between a second power supply rail and the amplifier output. The bases of the two output transistors are coupled to respective ones of the first and second driver stage outputs.

34 Claims, 4 Drawing Sheets

HIGH SWING OUTPUT CIRCUIT HAVING DIFFERENTIAL TO SINGLE-ENDED CONVERSION AND METHOD

CROSS REFERENCE TO RELATED APPLICATIONS

The present application is a continuation-in-part of Ser. No. 09/544,009 now U.S. Pat. No. 6,366,170 entitled "PNP HIGH-CURRENT, HIGH-SWING OUTPUT STAGE AND METHOD" filed on Apr. 6, 2000.

FIELD OF THE INVENTION

The present invention relates generally to amplifier circuits and, in particular, an output stage of an amplifier which converts a differential signal to a single-ended signal and which has an output voltage swing that is capable of approaching the upper and lower power supply voltages.

DESCRIPTION OF RELATED ART

There is an increasing demand for amplifier circuits having the capability of accepting input signals that come very close to the upper and lower supply voltages and capable of providing outputs which have the same capability. This is especially true in those application where the power supply voltages are small. It is also desirable that the amplifier circuit be capable of converting differential input signals to a single-ended output.

Figure 1:
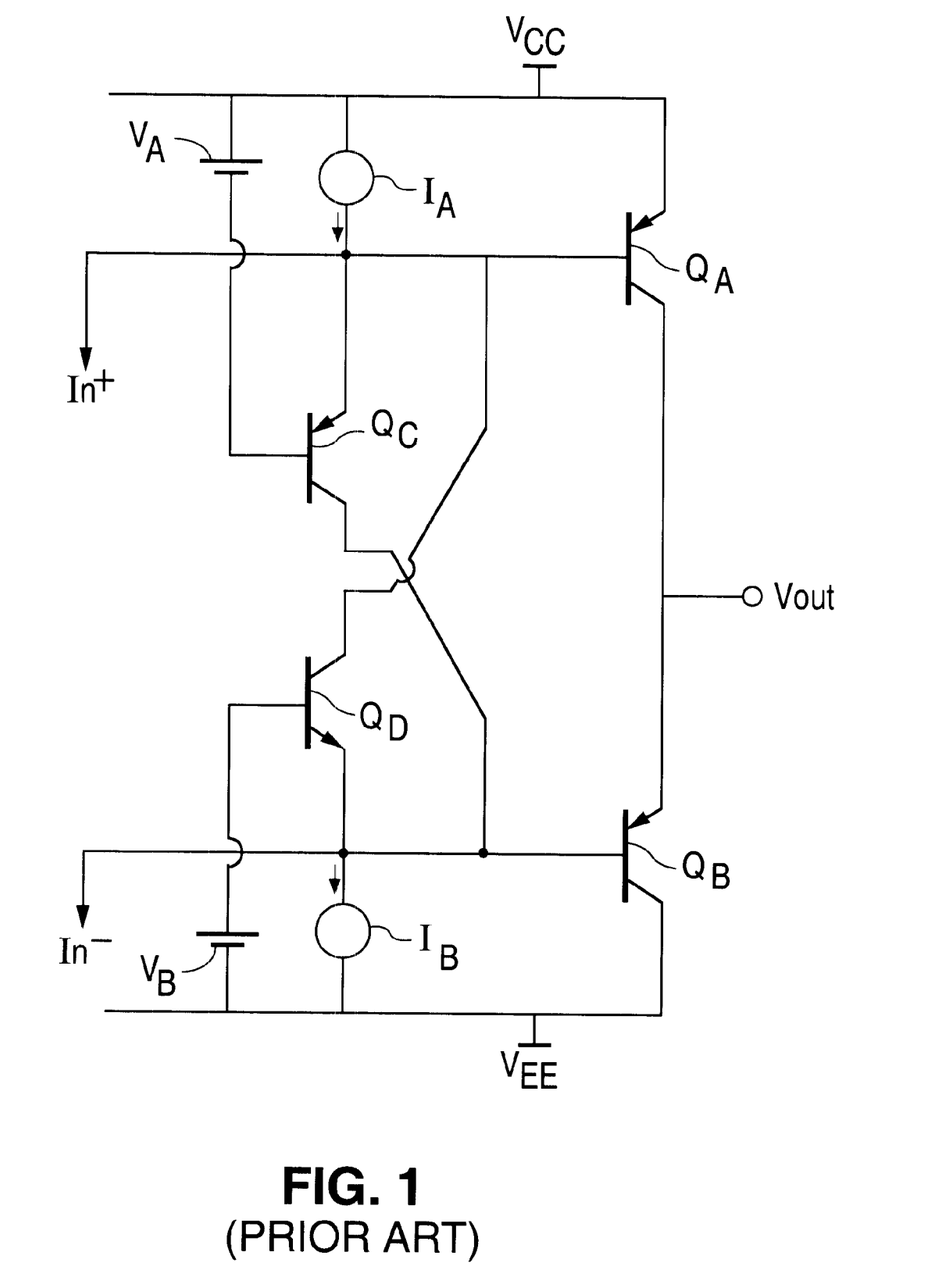
FIG. 1 is a schematic diagram of a conventional amplifier output stage having an output capable of swinging close to the power supply rails.

FIG. 1 is a schematic diagram of an exemplary amplifier output stage which is preceded by an input stage, not depicted, which converts a differential input into a single-ended current output. Additional details regarding this type of amplifier output stage are set forth in U.S. Pat. No. 4,570,128 entitled "Class AB Output Circuit With Large Swing." In order to permit operation with the differential input near the power supply rails, the input stage is configured to produce two outputs, only one of which is active at any particular time. Thus, the output stage of FIG. 1 is capable of being driven by either In1 or In2.

When the input signal falls within the upper region of the supply voltage range defined by VCC and VEE, signal In1 is active and signal In2 is inactive. Thus, signal In1 will vary with the input signal and signal In2 will be zero. Similarly, when the amplifier input signal is the lower region of the power supply range, signal In2 is active and signal In1 is inactive.

Output transistor $Q_A$ of the prior art output stage is a common-emitter configured PNP transistor having a collector connected to the amplifier stage output. Similarly, output transistor $Q_B$ is a common-emitter configured NPN transistor having a collector connected to the amplifier stage output. Output transistor $Q_A$ is driven by NPN transistor $Q_D$. The amplifier output stage of FIG. 1 is configured to operate as a class AB amplifier having a relatively small quiescent current when not driving a load and capable of sourcing and sinking relatively large amounts of current when demanded by a load. The quiescent current flow through output transistors QA and QB from supply VCC to supply VEE is determined by the magnitudes of the bias voltages VA and VB and current sources IA and IB. The output stage is used in a closed loop configuration so that the input In1 or In2 will be adjusted until the output transistors QA and QB conduct equal amounts of current.

When current input In1 is the active input, an increase in current In1 will turn on output transistor QA harder. Current IC through transistor QC will drop since less current is available form source IA. The lower current IC of QC will mean that the current ID of transistor QD must increase since source IB will remain constant. The increase in ID will increase the base current drive of transistor $Q_A$ thereby reinforcing the effect of an increasing the value of In1. In addition, the increase in current IC will increase the base voltage of output transistor QB thereby causing transistor QB to conduct less current. Thus, voltage Vout will increase towards supply VCC.

Vout will increase towards supply VCC and can be driven until transistor $Q_A$ is in saturation. In that case Vout is at supply voltage VCC less the saturation voltage Vsat of transistor $Q_A$, with Vsat typically being less than 0.1 volts.

Assuming that input In1 drops in magnitude and assuming the input In2 is still inactive, output transistor QA will tend to turn off. In addition, current IC through transistor QC will increase thereby causing the current ID through transistor QD to drop. This will cause the base-emitter voltage of QD to decrease. Since the base voltage of QD is fixed by VB, the base voltage of transistor QB will drop thereby increasing the base-emitter voltage of output transistor QB and causing QB to turn on harder thereby causing Vout to drop towards VEE. Operation with In2 active and In1 inactive is similar.

Although the FIG. 1 output circuit provides many advantages, including simplicity, the circuit does have shortcomings. By way of example, relatively low impedances at the emitters of transistors QC and QD make the transresistance gain of the circuit very low. Further, the voltage gain of the output stage is not the same for increasing and decreasing inputs. For example, when In1 increases, transistor QC is off, with transistor QD acting as a common base amplifier having a high voltage gain. On the other hand, when In1 decreases, the gain is reduced. This difference in voltage gain makes the amplifier output stage more difficult to stabilize.

SUMMARY OF THE INVENTION

An amplifier output circuit and method are disclosed. The output circuit includes a level shifting circuit configured to receive a differential input signal having first and second components. Typically, the differential input signal is in the form of a differential current output signal as produced by a differential input stage. The level shifting circuit defines first and second current paths, each having a transistor connected in series with the respective path.

The level shifting circuit is followed by a driver stage having a first input coupled to the first current path of the level shifting circuit and a second input coupled to the second current path of the level shifting circuit. The driver stage produces first and second outputs indicative of the voltage levels on the first and second current paths, respectively.

The output circuit further includes a common mode feedback path configured to alter current flow in the first and second current paths in response to the voltage levels on the first and second current paths. In one embodiment, the common mode feedback path further provides an output current limit function.

The driver stage of the amplifier output circuit drives an output stage. The output stage includes a further transistor having a base coupled to the first output of the driver stage and coupled between a first power supply rail and an amplifier output. In one embodiment, the transistor is a PNP transistor having an emitter coupled to a power supply rail which is positive with respect to a second power supply rail. A still further transistor has a base coupled to the second output of the driver stage and is coupled between the amplifier output and the second power supply rail. In one embodiment, the transistor is a NPN transistor having a collector coupled to the amplifier output and an emitter coupled to a power supply rail which is negative with respect to the first power supply rail.

DETAILED DESCRIPTION OF THE DRAWINGS

Figure 2:
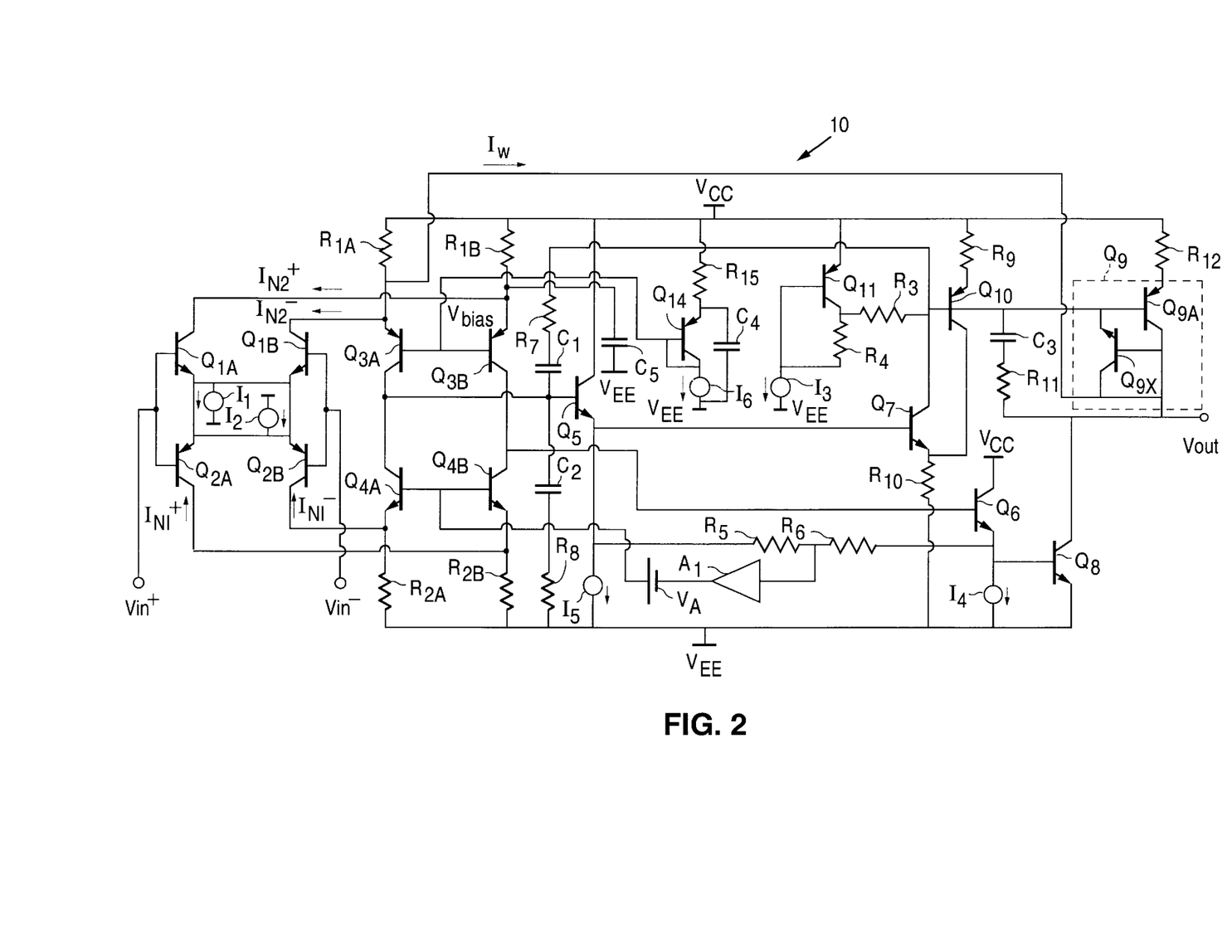
FIG. 2 is a schematic diagram of a amplifier circuit which includes an amplifier output circuit in accordance with one embodiment of the present invention.

Referring again to the drawings, FIG. 2 is a schematic diagram of an amplifier circuit 10 which incorporates one embodiment of the subject output stage. It will be appreciated that other implementations of output stages in accordance with the present invention can be made.

Amplifier circuit 10 includes an input stage capable of operating with differential input Vin+ and Vin− operating close to the power supply rails VCC and VEE. The input stage includes NPN transistors Q1A and Q1B connected as a differential pair together with a tail current source I1. PNP transistors Q2A and Q2B form a second differential pair connected to a tail current source I2. The common bases of transistors Q1A and Q2A are connected to receive input Vin+, with the common based of transistors Q2A and Q2B being connected to received input Vin−.

Although not depicted, tail current steering circuitry operates to sense the common mode input voltage, (Vin++Vin−)/2, and turn off source I2 when the common mode input voltage is in the upper region of the voltage range defined by VCC and VEE and to turn off source I1 when the common mode voltage is in the lower region of the range. Thus, current outputs IN1+ and IN1− of differential pair Q2A and Q2B drop to zero when the common mode input voltage is in the upper range so that differential pair Q2A and Q2B are inactive. Similarly, current outputs IN2+ and IN2− of differential pair Q1A and Q1B drop to zero when the common mode input voltage is in the lower half of the voltage range thereby rendering differential pair Q1A and Q1B inactive.

The intermediate stage following the input stage is sometimes referred to as a cascode dual input turn-around stage. The output stage following the intermediate stage, together with the intermediate stage, are implemented in accordance with one embodiment of the present invention.

The intermediate stage includes a pair of PNP transistors Q3A and Q3B connected in a common base configuration for level shifting currents IN2+ and IN2−. Transistors Q3A and Q3B are connected in series with resistors R1A and R1B, respectively, and are biased by voltage Vbias for operation close to upper supply voltage VCC. Voltage Vbias is produced by a PNP transistor Q14 which is connected as a diode. A resistor R15 is connected intermediate the emitter of Q14 and positive supply VCC. A current source I6 biases transistor Q14.

The intermediate stage further includes a pair of NPN transistors Q4A and Q4B connected in a common base configuration for level shifting currents IN1+ and IN1−. Resistors R2A and R2B are connected in series with transistors Q4A and Q4B, respectively, with the transistors being biased by the output of a common mode feedback circuit to be described.

One-half of the differential output of the turn around stage is connected to the base of emitter-follower configured NPN transistor Q5. The other half of the differential output is connected to the base of emitter-follower configured transistor Q6. A pair of equal value resistors R5 and R6 are connected in series between the emitters of transistors Q5 and Q6 so that the voltage intermediate the resistors is indicative of the common mode voltage of the intermediate stage. The intermediate voltage is connected to the input of a buffer circuit A1, the output of which is connected to a level shifting element VA. The output of element VA is connected to the common bases of transistors Q4A and Q4B so as to provide a common mode feedback path. The feedback maintains transistors Q4A and Q4B in the active region and ensures that Q3A and Q4A have equal collector currents and that Q3B and Q4B have equal collector currents. Further details of the construction of buffer A1 and level shifter VA will be provided later.

The output of emitter-follower configured transistor Q6 is connected to the base of output NPN transistor Q8. The collector of output transistor Q8 is connected to the output of the amplifier circuit 10 where Vout is produced. Transistors Q6 and Q7 provide current gain for the negative swing of Vout. Transistors Q5 and Q7 drive output PNP transistor Q9 and provide current gain for the positive swing of Vout. Output transistor Q9 is shown in FIG. 2 with the primary PNP transistor Q9A and an associated parasitic transistor Q9X. As will be explained in greater detail, current flow associated with parasitic transistor Q9X is used to prevent transistor Q9 from becoming deeply saturated.

It is desirable that the output stage have the same current gain when sourcing and sinking current. A significant difference in gain can render the amplifier using the output stage difficult to stabilize. Transistors Q6 and Q8 determine the current gain when sinking current, with the gain being approximately equal to the product of the gain of each transistor. The transistors that would normally determine the current gain when sourcing current include Q5, Q7 and Q9. PNP transistor Q10 is provided for limiting the current gain of Q9 so that the sinking current gain is closer to the sourcing current gain. A resistor R9 is connected between the emitter of Q10 and supply VCC, with the collector of Q10 being connected between the emitter of Q7 and a resistor R10. Increased current flow through Q7 tends to turn on transistor Q10 harder thereby increasing the voltage drop across resistor R10. Once the increase in voltage at the emitter of Q7 becomes large with respect to the value of kT/q, transistor Q7 will tend to turn off thereby decreasing base drive to output transistor Q9. This local feedback thus limits the current gain at high output sourcing currents and has no effect at lower currents. Resistor R12 connected between the emitter of Q9 and power supply VCC represents the various ballast resistors associated with the individual transistors which make up large transistor Q9. As is well known, these individual ballast resistors ensure that current flow is evenly distributed among the individual transistors.

Resistor R9 connected between the emitter of transistor Q10 and VCC operates to compensate for the voltage drop across resistor R12. In order to reduce power consumption, transistor Q10 has an emitter area which is typically 1/10 that of transistor Q9.

The quiescent current through output transistors Q8 and Q9 is well controlled since the base-emitter voltages of the two transistors are both defined. In the present case, the amplifier operates as a Class AB output, with there being a quiescent current typically of 250 μA and a peak output current of typically 100 mA.

Note that when the tail current switching circuitry (not depicted) operates to switch between differential pair Q1A/Q1B and Q2A/Q2B, the resultant change in currents IN2+ and IN2− will result in an undesirable change in current flow through transistors Q3A and Q3B. This will result in a change in the output quiescent current. In order to maintain a constant current in Q3A and Q3B, voltage Vbias is caused to decrease relative to VEE when pair Q1A/Q1B are made active to compensate for currents IN2+ and IN2−, the presence of which tend to cause the emitter voltages of Q3A and Q3B to drop. The change in Vbias can be accomplished by increasing the valve of I6. Assuming that R1A, R1B and R15 are the same valve and assuming that transistors Q3A, Q3JB and Q14 are the same size, this can be accomplished by increasing I6 by an equal amount to I1/2.

The FIG. 2 output stage provides current limiting with no loss in voltage swing of Vout. When the output stage is sinking a large amount of current from a load through transistor Q8, transistor Q6 is driven on as much as possible, with transistor Q5 being shut off. The common mode feedback provided by buffer A1 and related circuitry operates to maintain the buffer input at the node intermediate resistors R5 and R6 at a constant voltage in order to ensure that transistors Q4A and Q4B are biased correctly. Since transistor Q5 is off, all of the current drawn by current source I5 is drawn through resistors R5 and R6. Transistor Q6 is the source of the current flow through R5 and R6. Under quiescent conditions, there is negligible current flow through resistors R5 and R6. Given that the voltage at the node between resistors R5 and R6 remains constant, the base-emitter voltage of transistor Q8 will increase by the increase in voltage drop across R6 (I5×R6) from quiescent operation to current limit. Since the maximum base-emitter voltage of transistor Q8 is thus defined, the current limit point of Q8 is also defined.

When the output stage is sourcing the maximum amount of current to a load by way of transistor Q9, transistor Q6 is off and transistor Q5 is driven on as much as possible. Thus, resistors R5 and R6 conduct all of the current drawn by current source I4. The emitter voltage of transistor Q5 will increase by a voltage equal to the increase in voltage across resistor R5 (I4×R5). Again, since the maximum base-emitter voltage of Q5 is set, the maximum current through the transistor is set. Note that the change emitter voltage of transistor Q7 when transistor Q10 begins conducting so as to reduce the current gain has only a negligible effect on the operation of the current limit function provided by resistor R5 and current source I4.

Figure 3:
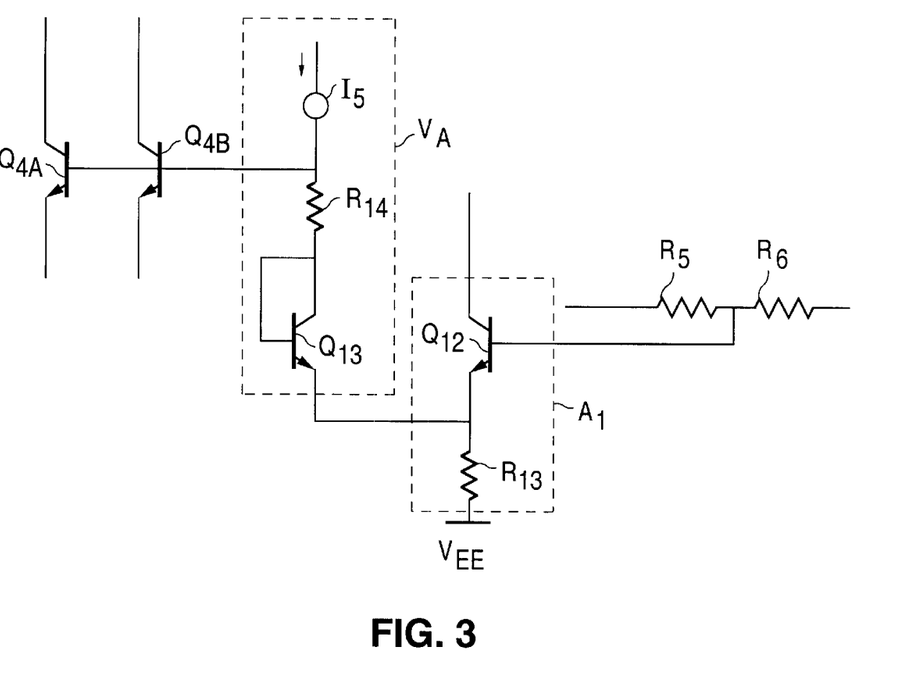
FIG. 3 is a schematic diagram of a detailed implementation of the common mode feedback circuit used in the FIG. 2 amplifier output stage.

FIG. 3 is a schematic diagram showing one implementation of the buffer A1 and the level shifting circuit VA. The buffer circuit includes an emitter-follower configured NPN transistor Q12 having a base connected to the node intermediate resistors R5 and R6 and an emitter connected to supply VEE by way of resistor R13. The output of the buffer A1 is the connected to the emitter of a diode-connected transistor Q13. A constant current source I5 provides a constant current that flows through a resistor R14 and transistor Q13 so the base-emitter voltage of Q12 is canceled by the base-emitter voltage of transistor Q13. Thus, the voltage applied to the common bases of transistors Q4A and Q4B is equal to the voltage at the node intermediate resistors R5 and R6 plus the voltage drop across R14 (I5×R14).

The base transistor Q9 is biased by a bais circuit which provided an optimum base-emitter voltage and optimum impedance. PNP transistor Q11 has an emitter connected to the supply VCC and a collector connected to a current source by way of a resistor R4. Since the base current of Q11 is relatively small, most of the current into current source I3 is by way of resistor R4. Inspection of the circuit shows that the voltage at the collector of Q11, the thevenin equivalent output voltage of the bias circuit, is the base-emitter voltage of Q11 less the voltage drop across R4 produced by current I3. The output impedance of the bias circuit is approximately equal to the resistance of R3 plus the output impedance of trasistor Q11. Output transistor Q9 is much larger, typically a few hundred times larger, the Q11. Thus, in order to bias Q9 with a base-emitter voltage so that Q9 conducts a desired quiescent current, typically on the order of 100 μA, it is necessary for the base-emitter voltage of Q11 to be reduced by some factor, typically by a 100 mV drop across resistor R4. The ouput impedance R of the bias circuit is selected such that the impedance in combination with Miller compensation capacitor C3 produce a pole at a frequency F=1/(2π R C3) as a frequency that is approximately 2 to 3 times the overall unity-gain frequency. The impedance is thus high enough so that the Miller compensation capacitor C3 can be effective. Further, the impedance is low enough such that settling time and slew performance are good.

One important aspect of the output stage of FIG. 2 is that there is only a single PNP transistor, Q9, in the forward signal path. Since PNP transistors usually have a lower $F_T$ (unity current gain-bandwidth product) and a lower β than an NPN transistor, performance is enhanced.

Figure 6:
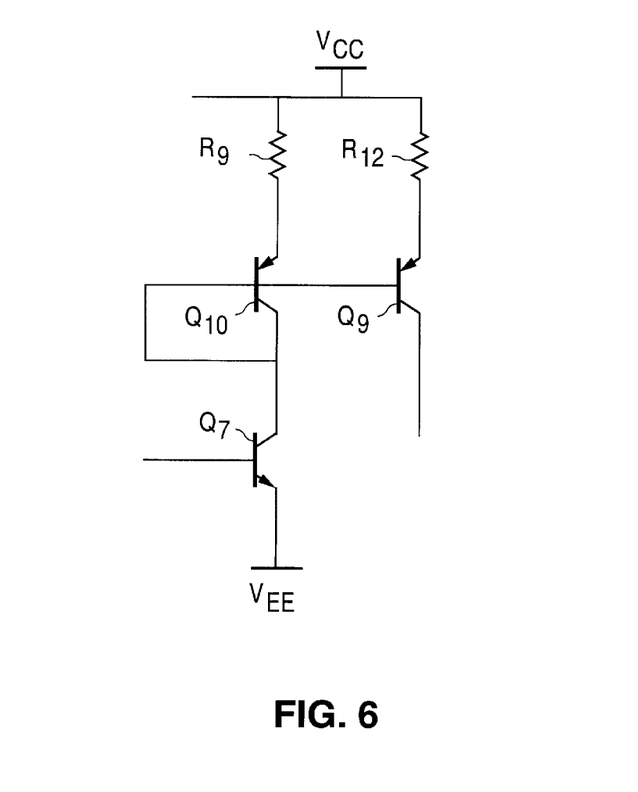
FIG. 6 is an alternative circuit arrangement for current gain limiting of the FIG. 2 amplifier output stage.

The FIG. 2 circuit is compensated by the Miller capacitor C3 and resistor R11 and by capacitor C2 and resistor R7. Unlike the prior art circuit of FIG. 1C, the impedance presented by resistor R3 and associated circuitry is large enough to make the Miller compensation capacitor C3 effective. Compensation capacitor C3 and R8 are optional. FIG. 6 shows an alternative connection for transistors Q7, Q9 and Q10 for limiting the current gain of the output stage when sourcing current. Rather than having the collector of Q10 connected to the emitter of transistor Q7 as shown in FIG. 2, transistor Q10 is diode-connected, with the collector/base of Q10 being connected to the collector of Q7. Transistors Q10 and Q9 operate together to form a current mirror, with the ratio of current between Q9 and Q10 effectively controlling the current gain of Q9. The current ratio of the two transistors is inversely related to the ratio of the emitter areas of Q9 and Q10, with Q9 typically being ten times larger than Q10. Thus, the effective current gain remains fixed at ten, a gain much lower than the typical current gain β of Q9 alone. Accordingly, the current gains for sourcing and sinking current are more closely matched thereby causing the circuit operation to be more stable. Note that resistor R9 in the FIG. 6 embodiment performs a function in addition to compensating for the presence of transistor Q9 ballast resistors R12. Resistor R9 increases the impedanceas the base of transitor Q9 thereby rendering the Miller compensation capacitor C3 (FIG. 2) effective.

Referring again to the FIG. 2 circuit, during normal operation, output voltage Vout is driven towards supply VCC so that transistor Q9 will be driven into saturation. Typically, the amplifier feedback action will attempt to force Vout to be equal to VCC, but no matter how much the base drive is increased, the saturation voltage will always be greater than zero. Further, the current gain or β of Q9 will decrease substantially as a result so that a large base drive current for Q9 will be required to support a given output current. Further, many types of transistor structures made using junction-isolated processes have parasitic transistors which can turn on during saturation. These parasitic transistors may cause latchup and unpredictable IC behavior as a result. In order to reduce the magnitude of the base drive current and to conserve power, and in order to prevent possible latchup with respect to transistor Q9, saturation control circuitry is provided for output transistors Q8 and Q9.

Although not depicted, a conventional inverted mode transistor is connected across the base-collector junction of transistor Q8 which prevents the base-collector junction from being forward biased thereby keeping the transistor out of saturation. The base and collector of the inverted mode transistor are connected to the base and collector, respectively, of Q8, with the emitter of the inverted mode transistor being connected to the base of Q6.

Figure 4:
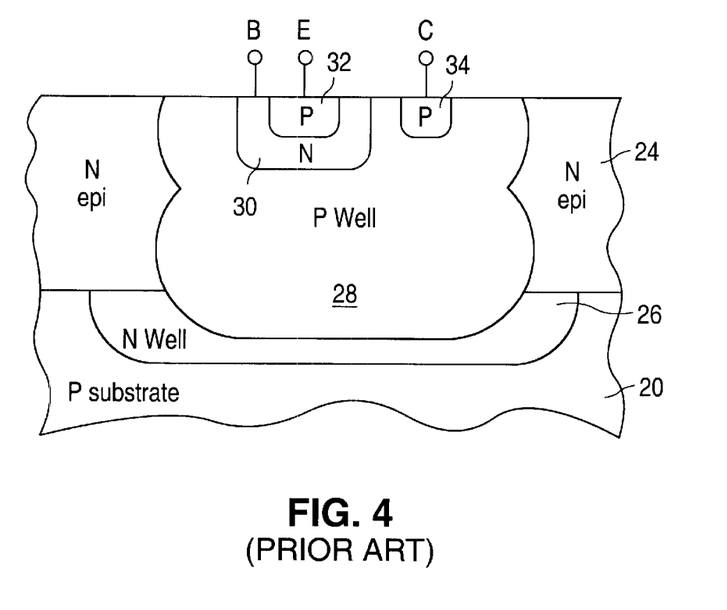
FIG. 4 is a cross-section of a conventional PNP transistor structure used as one of the output transistors of the FIG. 2 amplifier output stage.

The circuitry for limiting the saturation of transistor Q9 takes advantage of the junction-isolated vertical structure of the PNP transistor. FIG. 4 is a schematic illustration of a cross-section of in integrated circuit incorporating a PNP transistor such as Q9. The structure includes a P substrate 20 and an N type epitaxial layer 24. An N well 26 is formed in substrate followed by a P well 28 formed in the epitaxial layer 26 and substrate 20. A collector C contact for the PNP is formed in the P well 28 by way of P diffusion 34. An N region 30 is formed in the P well 28 to create the base B of the PNP, with the P region 32 formed in the N region 30 functioning as the emitter E of the transistor.

Figure 5:
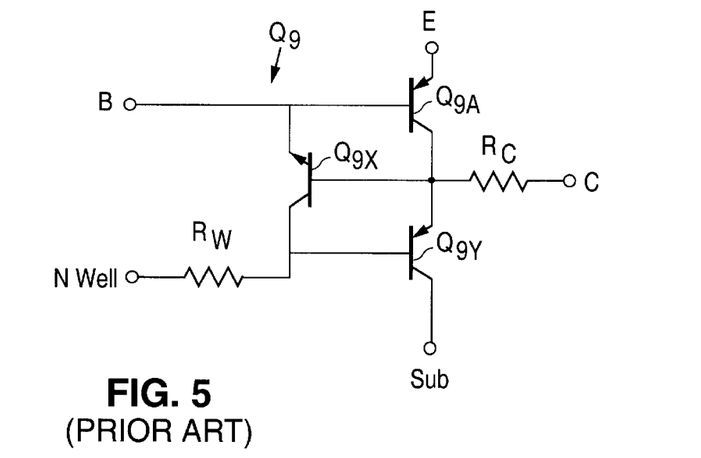
FIG. 5 is a schematic diagram of an equivalent circuit of the FIG. 4 transistor structure.

As previously noted, PNP transistor Q9 includes the desired transistor Q9A and a parasitic NPN transistor Q9X. The N type base region 30 forms the "emitter" of Q9X, the P well 28 forms the "base" and N well 26 forms the "collector". FIG. 5 is a schematic diagram showing the electrical relationship between desired transistor Q9A and the parasitic transistor Q9X. As can be seen from FIG. 5, there is also a parasitic PNP transistor Q9Y having an "emitter" formed by the P well 28, a "base" formed by the N well 26 and a "collector" formed by the substrate 20.

When the desired PNP transistor Q9A is driven into saturation, the collector-base junction becomes forward biased. If the forward biasing voltage is large enough, the "base-emitter" junction of parasitic transistor Q9X becomes forward biased thereby tuning the normally-off parasitic transistor Q9X on. This causes some of the base drive current for Q9 to be diverted to the N well 26 in the form of well current $I_w$. This current will cause a voltage to be developed across the N well parasitic resistance $R_w$ having a polarity which will tend to forward bias parasitic transistor Q9Y. As desired transistor Q9A is driven deeper into saturation, current $I_w$ will increase until one base-emitter voltage is developed across parasitic resistance $R_w$ thereby turning on parasitic PNP transistor Q9Y. This causes current flow from the upper supply VCC connected to the emitter of Q9A to the lower supply VEE connected to substrate 20, a current which can greatly exceed the quiescent current of the output stage. Thus, it is important to control the saturation limit of transistor Q9 so that the transistor will be deep enough into saturation to permit Vout swing up close to upper supply VCC and not so deep as to turn on the parasitic PNP transistors.

Saturation of transistor Q9 is controlled by monitoring the N well current $I_w$ of the transistor, that is, the current flow into the collector of parasitic transistor Q9X. The magnitude of this current is a function of the degree of forward bias of the base-collector junction of parasitic transistor Q9Y which represents the degree to which the transistor Q9Y is saturated.

As can be seen in FIG. 2, the N well of output transistor Q9 is connected to the node intermediate resistor R1A and transistor Q3A. When transistor Q9 is driven hard so that Vout approaches supply VCC, the transistor begins to saturate. As a result, current $I_w$ will begin to increase thereby decreasing the emitter voltage of transistor Q3A. This will cause the transistors Q5 and Q7 to begin to turn off thereby limiting base drive to Q9. Well current $I_w$ will no longer increase thereby allowing Q9 to remain saturated, but not so deeply saturated that parasitic transistor Q9Y (FIG. 5) is turned on.

The collector-to-N well capacitance of output transistor Q9 can be relatively large. The saturation control connection from Q9 back to Q3A provides a positive AC feedback path which requires compensation. Capacitor C4 connected between the node intermediate the emitter of transistor Q14 and resistor R14 and the negative supply voltage VEE compensates for the parasitic capacitance of Q9. Capacitor C5 connected between the node intermediate Q3B and resistor R1B and negative supply VEE compensates for the effect of capacitor C4. Ideally, capacitor C4 is a junction capacitor made to track the parasitic capacitance of Q9.

Thus, a novel output stage having high voltage swing capability has been disclosed. Although one embodiment has been described in some detail, it is to be understood that certain changes can be made by those skilled in the art without departing from the spirit and scope of the invention as defined by the appended claims.

What is claimed is:

1. An amplifier output circuit for receiving a differential input signal and producing a single-ended output signal indicative of the input signal, said output circuit comprising:
   a level shifting circuit configured to receive the differential input signal having first and second components, said level shifting circuit defining a first current path disposed intermediate first and second power supply rails and controlled by the first component of the differential input signal and a second current path disposed intermediate the first and second power supply rails and controlled by the second component of the differential input signal, first and second transistors connected in series with the first and second current paths, respectively, with the first and second transistors being disposed intermediate the respective current paths and a same one of the power supply rails;
   a driver stage having a first input coupled to the first current path at a node intermediate the first transistor and the power supply rail other than the same one of the power supply rails and a second input coupled to the second current path at a node intermediate the second transistor and the power supply rail other than the same one of the power supply rails and a first output indicative of a voltage level on the first current path and a second output indicative of a voltage level on the second current path;
   a common mode feedback circuit configured to alter current flow in the first and second current paths in response to the voltage level on the first current path and the voltage level on the second current path; and an output stage including a third transistor coupled between the first supply rail and an amplifier output where the single-ended output signal is produced and having a base coupled to the driver stage first output and a fourth transistor coupled between the second supply rail and the amplifier output and having a base coupled to the driver stage second output.

2. The amplifier output circuit of claim 1 wherein the third transistor is a PNP transistor having a collector coupled to the amplifier output and the fourth transistor is an NPN transistor having a collector coupled to the amplifier output.

3. The amplifier output circuit of claim 2 wherein the driver stage includes a fifth transistor having a base coupled to the first current path and a sixth transistor having a base coupled to an emitter of the fifth transistor, a seventh transistor having a base coupled to the second current path and an emitter coupled to a base of the fourth transistor.

4. The amplifier output circuit of claim 3 wherein the driver stage further includes an eighth PNP transistor having an emitter coupled to the first supply rail and a base coupled to the base of the third transistor and to the sixth transistor.

5. The amplifier output circuit of claim 4 wherein a collector of the eighth PNP transistor is coupled to an emitter of the sixth transistor.

6. The amplifier output circuit of claim 4 wherein a collector of the eighth PNP transistor is coupled to a collector of the sixth transistor.

7. The amplifier output circuit of claim 3 wherein the common mode feedback circuit includes a resistive divider coupled intermediate the first and second current paths of the level shifting circuit, with a voltage node on the resistive divider being indicative of a common mode voltage of the first and second current paths.

8. The amplifier output circuit of claim 7 further including current limit circuitry configured to limit an output current of the amplifier circuit in response to current flow through the resistive divider.

9. The amplifier output circuit of claim 8 wherein the resistive divider includes first and second resistors, with the voltage node being disposed intermediate the first and second resistors, wherein the common mode feedback circuit operates to maintain the voltage node at a relatively constant level, wherein output current sourcing is limited in response to a change in voltage developed across the first resistor and output current sinking is limited in response to a change in voltage developed across the second resistor.

10. The amplifier output circuit of claim 9 wherein resistive divider is coupled intermediate emitters of the seventh and fifth transistors.

11. The amplifier output circuit of claim 10 wherein the driver stage includes a first current source disposed intermediate the emitter of the seventh transistor and the second supply rail and a second current source disposed intermediate the emitter of the fifth transistor and the second supply rail.

12. An amplifier output circuit comprising:

a level shifting circuit configured to receive a differential input signal having first and second components, said level shifting circuit defining a first current path controlled by the first component of the differential input signal and a second current path controlled by the second component of the differential input signal, first and second transistors coupled in series with the first and second current paths, respectively, and first and second resistors coupled intermediate the first and second transistors, respectively, and a first power supply rail;

a driver stage including a third transistor having a base coupled to the first current path at a node intermediate the first transistor and a second power supply rail, a fourth transistor having a base coupled to an emitter of the third transistor and a fifth transistor having a base coupled to the second current path at a node intermediate the second transistor and the second power supply rail; and an output stage including a sixth transistor having an emitter coupled to the second power supply rail, a collector coupled to an amplifier output and a base coupled to a collector of the fourth transistor so that the fourth transistor collector conducts at least part of a base drive current of the sixth transistor and a seventh transistor having a base coupled to an emitter of the fifth transistor, an emitter coupled to the first power supply rail and a collector coupled to the amplifier output.

13. The amplifier output circuit of claim 12 further including a common mode feedback circuit having an input indicative of an average voltage at the first and second current path nodes and an output coupled to bases of the first and second transistors.

14. The amplifier output circuit of claim 13 wherein the common mode feedback circuit includes first and second resistors coupled in series between the emitters of the third and fifth transistors.

15. The amplifier output circuit of claim 14 further including current limit circuitry configured to limit amplifier output current sourcing in response to a change in voltage across the first resistor.

16. The amplifier output circuit of claim 15 wherein the current limit circuitry is configured to limit amplifier output current sinking in response to a change in voltage across the second resistor.

17. The amplifier output circuit of claim 16 wherein a first current source is disposed intermediate the emitter of the fifth transistor and the first supply rail and wherein the change in voltage across the first resistor is approximately equal to the product of a resistance of the first resistor and a magnitude of current drawn by the first current source.

18. The amplifier output circuit of claim 17 wherein a second current source is disposed intermediate the emitter of the fifth transistor and the first supply rail and wherein the change in voltage across the second resistor is approximately equal to the product of a resistance of the second resistor and a magnitude of current drawn by the second current source.

19. The amplifier output circuit of claim 12 wherein the second power supply rail is positive with respect to the second power supply rail when the amplifier circuit is powered and wherein the sixth transistor is a PNP transistor and the seventh transistor is an NPN transistor.

20. The amplifier output circuit of claim 19 wherein the third, fourth and fifth transistors are NPN transistors.

21. An amplifier output circuit comprising:

a first transistor having an emitter coupled to a first power supply rail and a collector coupled to an amplifier output;

a second transistor having an emitter coupled to a second power supply rail and a collector coupled to the amplifier output;

a third transistor having a base connected to receive a first component of a differential input signal;

a fourth transistor having a base coupled to an emitter of the third transistor and an emitter coupled to the second power supply rail and a collector coupled to a base of the first transistor so that the collector of the fourth transistor conducts at least part of a base current of the first transistor; and a fifth transistor have a base connected to receive a second component of the differential input signal and an emitter coupled to a base of the second transistor.

22. The amplifier output circuit of claim 21 further including a sixth transistor coupled to the first and the fourth transistors and configured to limit a total current gain provided by the fourth and first transistors.

23. The amplifier output circuit of claim 22 wherein the sixth transistor includes a base coupled to a base of the first transistor.

24. The amplifier output circuit of claim 23 wherein the sixth transistor is a PNP transistor with the base being coupled to a collector of the fourth transistor.

25. The amplifier output circuit of claim 24 wherein the sixth transistor has a collector coupled to the fourth transistor.

26. The amplifier output circuit of claim 25 wherein the emitter of the fourth transistor is coupled to the second power supply rail by way of a first resistor, with the collector of the sixth transistor being coupled to a node intermediate the emitter of the fourth transistor and the first resistor.

27. The amplifier output circuit of claim 25 wherein the collector of the sixth transistor is coupled to the collector of the fourth transistor.

28. The amplifier output circuit of claim 21 further including current limit circuitry coupled to the emitters of third and fifth transistors and configured to limit an increase in a voltage at the emitters of the third and fifth transistors to a predetermined maximum level relative to the second power supply rail.

29. The amplifier output circuit of claim 28 further including a first current source coupled intermediate the emitter of the third transistor and the second power supply rail and a second current source coupled intermediate the emitter of the fifth transistor and the second power supply rail and wherein the current limit circuit includes a resistor network connected intermediate the emitters of the third and fifth transistors.

30. The amplifier output circuit of claim 29 wherein resistor network includes first and second resistors connected in series between the emitters of the third and fifth transistors and the current limit circuit includes circuitry for maintaining a voltage at a node intermediate the first and second resistors at a relatively constant value relative to the first and second components of the differential input signal.

31. A method of current limiting an amplifier output stage capable of providing a sourcing output current from a first transistor of the output stage and a sinking output current from a second transistor of the output stage, with the first and second transistors having collectors coupled to an output of the output stage and third and fourth transistors connected to drive the first and second output transistors, respectively, said method comprising:

switching the fourth transistor from a conductive to a substantially non-conductive state in response to an increase in the sourcing output current;

limiting a base-emitter voltage of the third transistor to a maximum value in response to the change in the fourth transistor from a conductive to a substantially non-conductive state so as to limit the sourcing output current;

switching the third transistor from a conductive to a substantially non-conductive state in response to an increase in the sinking output current; and limiting a base-emitter voltage of the fourth transistor to a maximum value in response to the change in state of the third transistor from a conductive to a substantially non-conductive state so as to limit the sinking output current.

32. The method of claim 31 wherein the amplifier output circuit includes a first and second resistors coupled to emitters of the third and fourth transistors, respectively, and wherein the limiting a base-emitter voltage of the third transistor includes conducting a first maximum current through the first resistor in response to the fourth transistor change in state and the limiting a base-emitter voltage of the fourth transistor includes conducting a second maximum current through the second resistor in response to the third transistor change in state.

33. The method of claim 32 further including maintaining a common node connection of the first and second resistors at a relatively constant voltage.

34. The method of claim 33 further including conducting the first maximum current from a common junction of the second resistor and the emitter of the fourth transistor and conducting the second maximum current from a common junction of the first resistor and the emitter of the third transistor.

* * * * *